United States Patent [19]
Gillard et al.

[11] Patent Number: 5,404,166
[45] Date of Patent: Apr. 4, 1995

[54] VARIABLE-LENGTH TO FIXED-LENGTH DATA WORD REFORMATTING APPARATUS

[75] Inventors: Clive H. Gillard; Michael J. Ludgate, both of Basingstoke, United Kingdom

[73] Assignee: Sony United Kingdom Ltd., Staines, United Kingdom

[21] Appl. No.: 111,443

[22] Filed: Aug. 25, 1993

[30] Foreign Application Priority Data

Sep. 9, 1992 [GB] United Kingdom ............ 9219054

[51] Int. Cl.⁶ .................................. H04N 7/12
[52] U.S. Cl. ............................. 348/390; 341/67; 348/391; 375/242
[58] Field of Search .......... 348/384, 390, 391, 488, 348/469; 375/25; 358/426; 341/67; H04N 7/12

[56] References Cited

U.S. PATENT DOCUMENTS

| | | |
|---|---|---|
| 4,937,666 | 6/1990 | Yang . |
| 5,034,742 | 7/1991 | Bond et al. ............. 341/67 |
| 5,245,338 | 9/1993 | Sun ....................... 341/67 |
| 5,255,090 | 10/1993 | Israelsen ............. 341/67 X |

FOREIGN PATENT DOCUMENTS

| | | |
|---|---|---|
| 0348207 | 12/1989 | European Pat. Off. . |
| 0384782 | 8/1990 | European Pat. Off. . |
| 0445727 | 9/1991 | European Pat. Off. . |
| 0453113 | 10/1991 | European Pat. Off. . |
| 2260428 | 4/1993 | United Kingdom . |
| WO89/07372 | 8/1989 | WIPO . |

OTHER PUBLICATIONS

Conference: Signal Processing of HDTV, II; Proc Third Workshop on HDTV, pp. 131–137; M. Ziegler. Also INSPEC abstract B91011288 1990.
Patent Abstracts of Japan vol. 16, No. 337 (P-1390) 22 Jul. 1992 & JP-A-41 02 120 (Matsushita Electric Ind Co).
Patent Abstracts of Japan vol. 16, No. 312 (E-1230) 9 Jul. 1992 & JP-A-40 86 195 (Matsushita Electric Ind Co).

*Primary Examiner*—Victor R. Kostak
*Attorney, Agent, or Firm*—William S. Frommer; Alvin Sinderbrand

[57] ABSTRACT

Data formatting apparatus for formatting variable bit length data words into successive fixed bit length data words comprises an N-bit circular buffer comprising a plurality of concatenated buffer sections, each buffer section having the same bit length as one of the fixed bit length data words. A modulo-N counter generates a count of the cumulative length of received variable bit length data words. Each received variable bit length data word is stored in the N-bit circular buffer at a bit position dependent on the count signal, and, in response to a detection that data has been stored in all of the bits of that buffer section, the stored data from that buffer section is output as a fixed bit length data word.

13 Claims, 6 Drawing Sheets

| Bits: | Code Words: | | | | | | | |
|---|---|---|---|---|---|---|---|---|
| | 1 | 2 | 3 | 4 | 5 | 6 | 7 | 8 |
| 0 | X | | | X | | | X | |
| 1 | X | | | X | | | | X |
| 2 | X | | | X | | | | X |
| 3 | X | | | X | | | | X |
| 4 | X | | | X | | | | X |
| 5 | X | | | X | | | | X |
| 6 | X | | | X | | | | X |
| 7 | Ⓧ | | | Ⓧ | | | | | MSB
| 8 | X | | | | X | | | |
| 9 | X | | | | X | | | |
| 10 | | X | | | X | | | |
| 11 | | X | | | X | | | |
| 12 | | X | | | X | | | |
| 13 | | X | | | X | | | |
| 14 | | X | | | X | | | |
| 15 | | Ⓧ | | | | Ⓧ | | | MSB
| 16 | | X | | | | X | | |
| 17 | | X | | | | X | | |
| 18 | | X | | | | X | | |
| 19 | | X | | | | X | | |
| 20 | | X | | | | X | | |
| 21 | | X | | | | X | | |
| 22 | | X | | | | X | | |
| 23 | | Ⓧ | | | | Ⓧ | | | MSB
| 24 | | | X | | | X | | |
| 25 | | | X | | | X | | |
| 26 | | | X | | | | X | |
| 27 | | | X | | | | X | |
| 28 | | | | X | | | X | |
| 29 | | | | X | | | X | |
| 30 | | | | X | | | X | |
| 31 | | | | Ⓧ | | | Ⓧ | | MSB

| | 1 | 2 | 3 | 4 | 5 | 6 | 7 | 8 |
|---|---|---|---|---|---|---|---|---|
| Code Length: | 10 | 14 | 4 | 12 | 7 | 11 | 7 | 6 |
| Count mod 32: | 10 | 24 | 28 | 8 | 15 | 26 | 1 | 7 |

VARIABLE-LENGTH TO FIXED-LENGTH DATA WORD REFORMATTING APPARATUS

BACKGROUND Of THE INVENTION

1. Field of the Invention

This invention relates to the field of data formatting, and more particularly to the formatting of variable bit length data words into successive fixed bit length data words.

2. Description of the Prior Art

Some data compression systems produce compressed data comprising successive variable bit length code words. For example, in an image data compression system proposed by the Joint Photographic Experts Group (JPEG), image data are subjected to frequency separation, quantisation and then entropy encoding. The entropy encoding stage generates variable bit length data words in such a way that more commonly occurring data patterns (such as runs of zero-valued data) are encoded as shorter data words.

Although variable length encoding can allow data to be efficiently compressed, subsequent storage of the data or other processes such as error correction encoding generally operate on fixed length data words. It is therefore necessary to convert the variable length data words into fixed length data words. However, the data format conversion itself introduces an additional data processing overhead. In a non real time system, such as still image processing and display in a computer system, this is not a particular problem. However, in a system dealing with data such as real time video data, the high data rates present a particular challenge in providing data format conversion in a way that can keep pace with the overall data rate and only introduce a small time lag in the processing.

SUMMARY Of THE INVENTION

It is an object of the invention to improve the formatting of variable bit length data words into successive fixed bit length data words.

This invention provides a data formatting apparatus for formatting variable bit length data words into successive fixed bit length data words, said apparatus comprising:

(I) an N-bit circular buffer comprising a plurality of concatenated buffer sections, each said buffer section having a bit length equal to a bit length of said fixed bit length data words;

(II) a modulo-N counter for generating a count signal in response to a cumulative length of received variable bit length data words;

(III) means for storing a current variable bit length data word in said N-bit circular buffer at a bit position dependent on said count signal;

(IV) detecting means associated with each said buffer section for detecting whether data has been stored in all bits of said buffer section; and (V) means responsive to a detection that data has been stored in all bits of a buffer section for outputting stored data from said buffer section as a fixed bit length data word.

In a preferred embodiment the means for storing comprises an N-bit barrel-rotator operable to barrel-rotate each variable bit length data word by a number of bits dependent upon the count signal generated by the modulo-N counter in respect of the preceding variable bit length data word. In this way the most significant bit of the current variable length data word can be barrel-rotated to a bit position adjacent to the least significant bit of the preceding variable length data word, before the current variable bit length data word is stored in the N-bit buffer.

Preferably the means for storing comprises an enable generator, responsive to the count signals generated by the modulo-N counter in respect of the current and the preceding variable bit length data words, for generating respective write-enable signals to control writing of each bit of the current variable bit length data word from the barrel-rotator to the N-bit buffer.

In advantageously simple embodiments the detecting means associated with each buffer section is operable to detect the generation of a write-enable signal to control writing to a predetermined bit in that buffer section.

Viewed from a second aspect this invention provides a method of formatting variable bit length data words into successive fixed bit length data words, said method comprising the steps of:

(I) receiving variable bit length data words;

(II) generating a modulo-N count signal in response to a cumulative length of said received variable bit length data words;

(III) storing each said received variable bit length data word in an N-bit circular buffer at a bit position dependent on said count signal, said N-bit circular buffer comprising a plurality of concatenated buffer sections, each said buffer section having a bit length equal to a bit length of said fixed bit length data words;

detecting, for each said buffer section, whether data has been stored in all bits of said buffer section; and outputting stored data from a buffer section as a fixed bit length data word in response to a detection that data has been stored in all bits of said buffer section.

BRIEF DESCRIPTION Of THE DRAWINGS

The above and other objects, features and advantages of the invention will be apparent from the following detailed description of illustrative embodiments which is to be read in connection with the accompanying drawings, in which.

DESCRIPTION Of THE PREFERRED EMBODIMENTS

Figure 1:
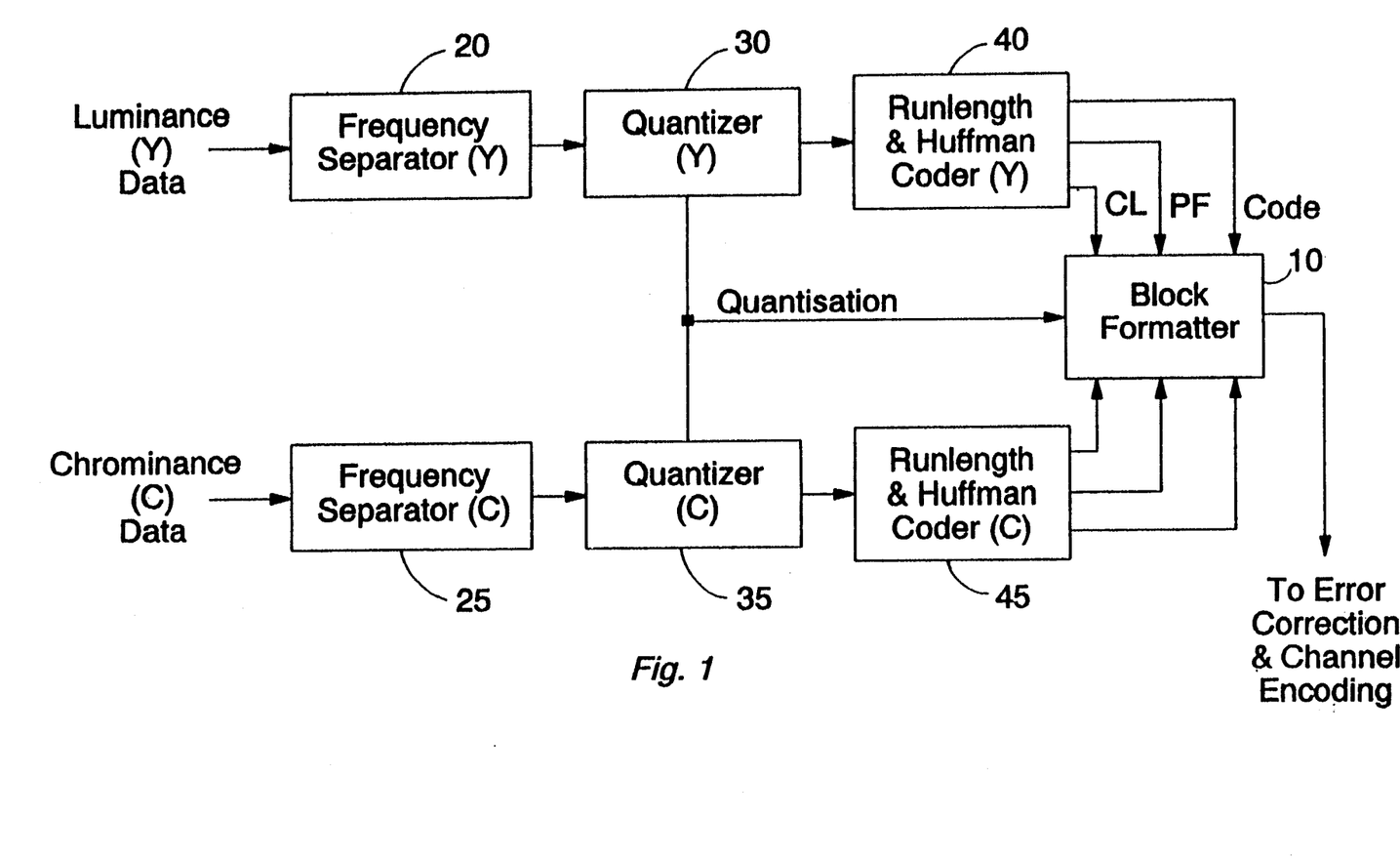
FIG. 1 is a schematic block diagram of a video data compression system.

Referring now to FIG. 1, a video data compression system is shown in which luminance (Y) and chrominance (C) video data are separately compressed before being combined into data blocks by a block formatter 10. The video data compression system shown is suitable for use in a digital video tape recorder (DVTR), in which case the data blocks output by the block formatter 10 are subjected to error correction processing and channel encoding before being recorded on a magnetic tape (not shown).

Substantially identical data compression processing is applied to the luminance data and the chrominance data, although the degree of compression applied may be different for the luminance data and for the chrominance data. The luminance and chrominance data are first supplied to respective frequency separators 20, 25 which include banks of horizontal and vertical finite impulse response filters that serve to split and decimate the data into respective frequency-transformed images comprising sub-band components in the two-dimensional spatial frequency domain. Data representing the frequency-transformed luminance and chrominance images are supplied from the frequency separators 20, 25 to respective quantisers 30, 35, in which the data are subjected to lossy quantisation. The quantised data are then passed, in the form of 12-bit data samples, to respective luminance and chrominance runlength and Huffman coders 40, 45. The runlength and Huffman coders 40, 45 exploit correlation within the quantised data to effect compression; their output comprises data words having a variable length in such a way that more commonly occurring data patterns within the quantised data are represented by shorter variable length data words.

Figure 2:
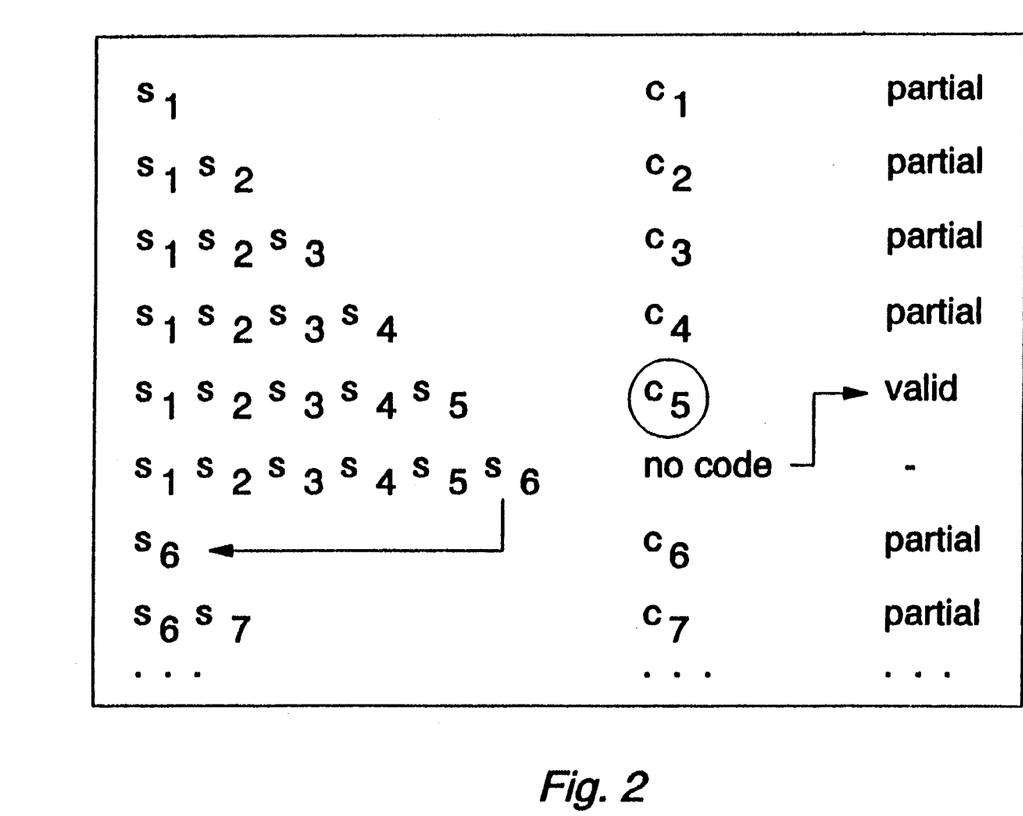
FIG. 2 is a schematic illustration showing the operation of a runlength and Huffman coder.

Each of the runlength and Huffman coders 40, 45 processes the quantised data in a serial fashion. As each 12-bit data sample of the quantised data is received, a "partial" (or interim) Huffman code is generated to represent the pattern of data samples of the quantised data received since a "valid" (or complete) Huffman code was last output by the runlength and Huffman coder. If a received data sample (when added to the pattern of data samples for which a partial code has been generated) results in a data sample pattern to which a Huffman code has not been assigned, the most recent partial code is output by the runlength and Huffman coder as a "valid" code, and the coding starts again from that received data sample. This processing is illustrated in FIG. 2, in which respective Huffman codes $c_1$ to $c_5$ are generated as the data samples $s_1$ to $s_5$ are received. The codes $c_1$ to $c_4$ are designated as partial codes, because, in each case, when the next data sample is received a new Huffman code can be generated. However, the data sample pattern formed by the concatenation of the pattern $s_1s_2s_3s_4s_5$ and the received data sample $s_6$ does not have a corresponding Huffman code and so cannot be encoded by the runlength and Huffman coder. The code $c_5$, representing the data sample pattern $s_1s_2s_3s_4s_5$, is therefore output as a valid Huffman code, and coding is restarted from the received data sample $s_6$.

In the present embodiment, the Huffman codes comprise data words having a variable length of up to 20 bits. At each stage of coding (i.e. as each sample of the quantised data is processed by the runlength and Huffman coder), either a partial or a valid Huffman code is output by the coder on a 20-bit parallel data bus. Any bits of the data bus not occupied by bits of the Huffman code are set to logical 1. At the same time, a 5-bit number indicating the length in bits of the current Huffman code is supplied on a "code length" (CL) output, and a "partial flag" (PF) output from the runlength and Huffman coder indicates whether the current Huffman code is a partial or a valid code. These three sets of output signals from each of the runlength and Huffman coders 40, 45 are supplied to the block formatter 10.

The variable length data words output by the luminance and chrominance runlength and Huffman coders 40, 45 in FIG. 1 are combined into a single data stream and formatted into fixed length data blocks by the block formatter 10. The block formatter 10 also receives signals from the quantisers 30, 35 indicative of the degree of quantisation applied to the compressed data currently being received by the block formatter.

As mentioned above, the formatted data blocks output by the block formatter 10 are subjected to error correction processing and channel encoding before being recorded on a magnetic tape.

Figure 3:
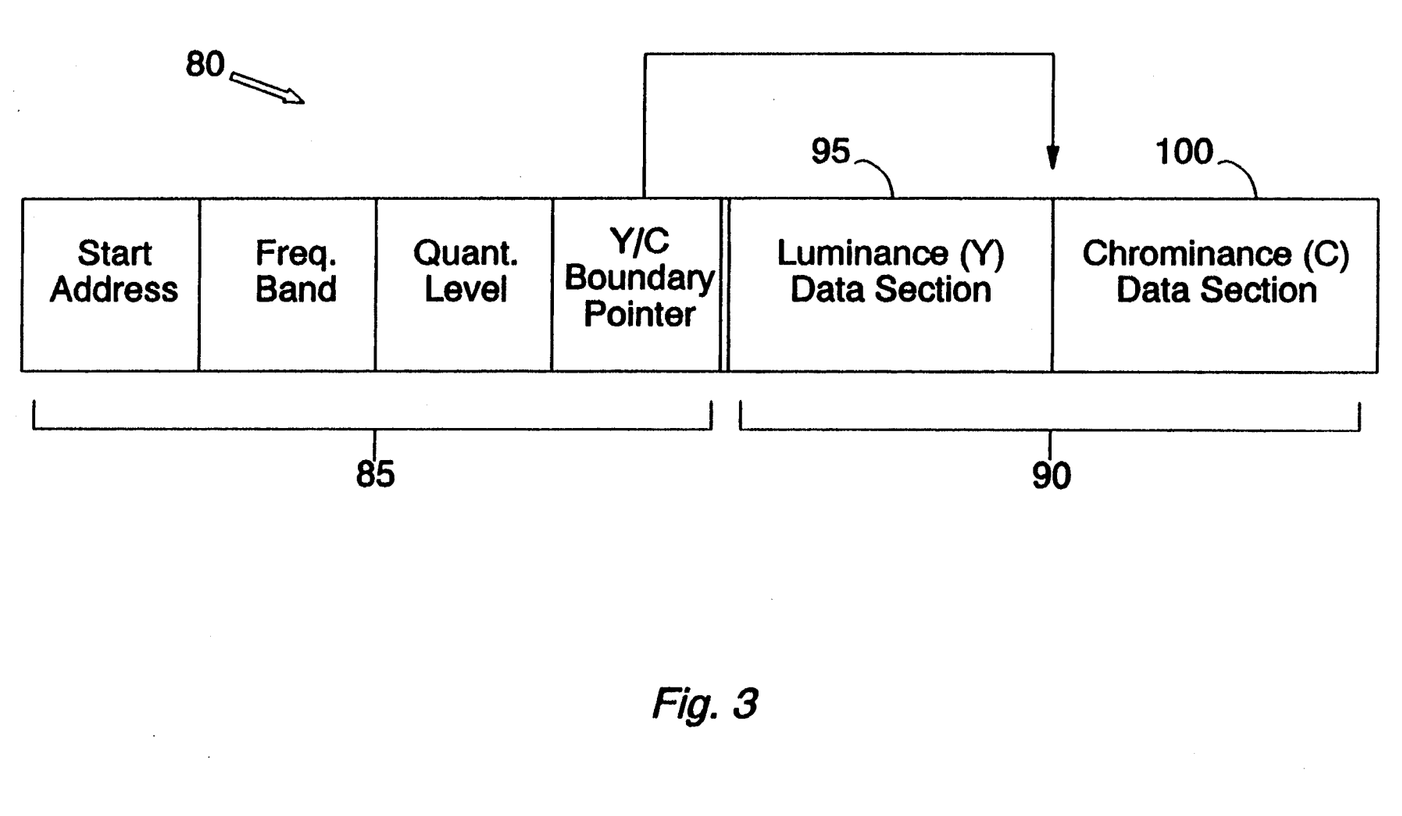
FIG. 3 is a schematic illustration off a formatted data block.

FIG. 3 is a schematic illustration of a formatted data block 80 generated by the block formatter 10. The data block 80 comprises a 4-byte header section 85 and a 120-byte video data section 90.

The video data section 90 comprises a luminance data section 95 and a chrominance data section 100, which represent identical portions of the frequency-transformed luminance and chrominance images generated by the respective frequency separators 20, 25. However, the relative sizes of the luminance data section 95 and the chrominance data section 100 will depend (amongst other things) on the respective degrees of quantisation applied by the quantisers 30 and 35, and on the information content of those portions of the transformed luminance and chrominance images.

Each formatted data block 80 is self-contained, in so far as it can be replayed and decoded even when adjacently recorded data blocks are not successfully replayed. This means that it is still possible to recover video data during, for example, shuttle (high speed) tape replay when only some of the data blocks are successfully replayed. This feature is made possible by including in each formatted data block 80 the header section 85 defining the relative sizes of the luminance and chrominance data sections, the degree of compression applied to the data in the video data section 90 and the portion of the respective frequency-transformed images represented by the luminance and chrominance data in the video data section 90. In particular, the header section 85 comprises a start address indicative of the position of the video data in the video data section 90 within the transformed images generated by the frequency separators 20 and 25; an indication of the spatial frequency band of the luminance and chrominance data in the data section 90; an indication of the degree of quantisation applied to that data; and a Y/C boundary pointer. The Y/C boundary pointer indicates the position within the video data section 90 of the boundary between the luminance data section 95 and the chrominance data section 100.

Figure 4:
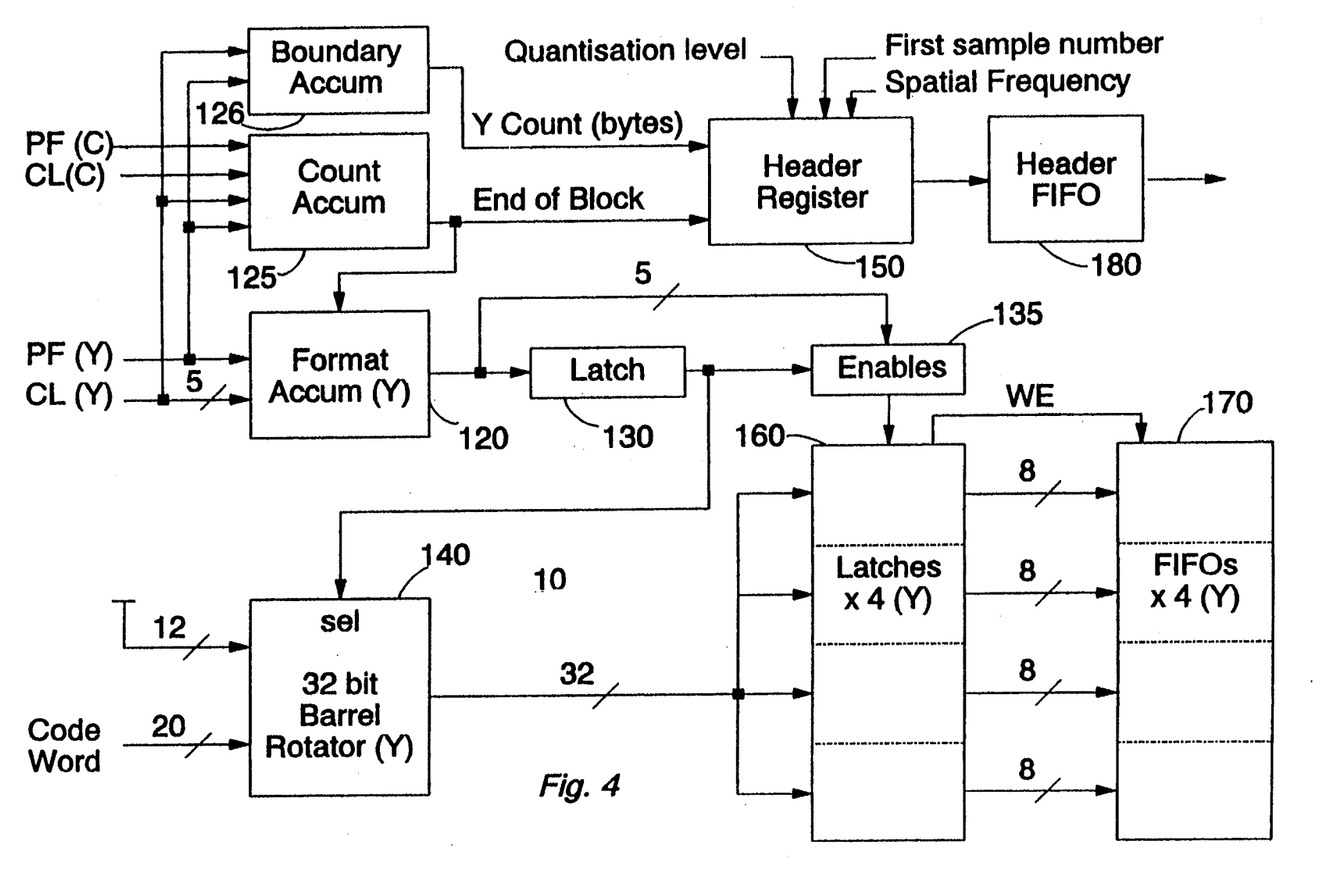
FIG. 4 is a schematic block diagram of the data input side of a block formatter.

FIG. 4 is a schematic block diagram of the data input side of the block formatter 10. In the block formatter 10, substantially identical processing is applied to the compressed luminance data received from the runlength and Huffman coder 40 and to the compressed chrominance data received from the runlength and Huffman coder 45. Accordingly, for clarity of the diagram, only the processing applied specifically to the luminance data, and the common processing applied to both luminance and chrominance data, have been shown.

The code length and partial code signals from the luminance runlength and Huffman coder 40 are received by a format accumulator 120. The format accumulator 120 generates a 5-bit output signal representing a modulo-32 count of the code lengths of valid luminance Huffman codes received during the formatting of a current data block. The count signal is supplied to a latch 130, to an enable generator 135, and (via the latch 130) to a 32-bit barrel-rotator 140.

A count accumulator 125 also receives the luminance code length and partial code signals, along with corresponding code length and partial code signals from the chrominance runlength and Huffman coder 45. The count accumulator 125 maintains a count of the cumulative lengths of valid luminance codes and of valid chrominance codes. These counts are then summed to generate a total count. When this total count reaches the available length of the video data section 90 (effectively 119 bytes, because the luminance and chrominance data sections are eventually rounded up to the nearest byte), an end of block signal is generated by the count accumulator 125. The end of block signal is supplied to the format accumulator 120, a header register 150, and the runlength and Huffman coders 40 and 45.

The value of the Y/C pointer is generated by a boundary accumulator 126. As described above, the Y/C pointer is included in the header section 85 of each formatted data block, and indicates the boundary between the luminance data section 95 and the chrominance data section 100 in that data block. The position of this boundary is defined only to the nearest byte (to reduce the number of bits required to represent the Y/C pointer) and is dependant on the quantity of luminance data contained in the luminance data section 95. Therefore, the boundary accumulator maintains a count of the cumulative length of the luminance Huffman codes to be included in each data block. When the end of a block is detected, the boundary accumulator 126 supplies the cumulative luminance code length (rounded up to the nearest byte) to the header register 150 for inclusion in the block header as the Y/C pointer.

As each valid luminance Huffman code is received by the block formatter, the length of that code in bits is added to the count held by the format accumulator 120. The Huffman code word itself is received on a 20-bit parallel data bus by the 32-bit barrel-rotator 140, with any unused bits of the data bus being set to logical 1. (The 12 remaining inputs of the 32-bit barrel-rotator are also set to logical 1). The barrel-rotator 140 operates to barrel-rotate the code word at its input by a number of bits corresponding to the previous count output of the format accumulator 120. At the same time, the enable generator 135 is supplied with the current and previous count outputs of the format accumulator 120 (i.e. directly and via the latch 130). From these two inputs, the enable generator 135 establishes which bits of the 32-bit barrel-rotator 140 are occupied by data bits of the Huffman code word, and sets corresponding enabling signals to control writing of only those bits from the barrel-rotator 140 into a 32-bit buffer 160.

The 32-bit buffer 160 comprises four 8-bit latches, concatenated together to form the 32-bit wide buffer.

The arrangement described above means that as each valid Huffman code word is received by the block formatter 10, that word is barrel-rotated so that that word's most significant bit (MSB) is stored in the buffer 160 immediately adjacent to the least significant bit (LSB) of the previously received valid code word. In this way, variable length Huffman code words received on a parallel data bus are abutted next to one another to form an essentially continuous data stream.

The abutted code words held in the buffer 160 are read out fop storage in a first-in-first-out (FIFO) store 170. The transfer from the buffer 160 to the FIFO store 170 takes place in fixed length 8-bit data words. To achieve this, whenever the MSB of one of the four 8-bit latches is selected by the enable generator 135 (indicating that data has been written to the whole of that 8-bit latch) a write enable (WE) signal is generated to control the transfer of the 8 bits of data previously held by that latch into the FIFO store 170.

When the count accumulator 125 detects that the end of a block of data has been reached, it supplies an end of block signal to the format accumulator 120. This has a number of effects. The current Huffman code is considered to be a valid code. The format accumulator 120 adds the current code length to its currently held count and rounds up the result to the nearest byte (i.e. the nearest multiple of 8 bits in modulo 2 arithmetic). Because the count has been rounded up to the nearest byte, the data transferred from the barrel-rotator 140 to the buffer 160 is padded with logical ones (if necessary) to fill a complete latch in the buffer 160. The logical ones are available either from unused bits of the 20-bit Huffman codes or from the twelve additional inputs to the barrel rotator 140.

Padding the last fixed length data word of the luminance data section 95 (and of the chrominance data section 100) does not cause problems when the Huffman codes are subsequently decoded. This is because a succession of up to seven logical ones does not form a Huffman code which represents valid data. Instead, the succession of logical ones is ignored by a subsequent Huffman decoder.

The header register receives the end of block signal from the count accumulator 125, along with the total number of bytes of luminance data in the current data block. The header register also receives an indication of the degree of quantisation applied to the data in that block (from the quantisers 30, 35), along with an indication of the frequency band of that data and the sample address of the first sample represented by the data (both of which are determined by the runlength and Huffman coders 40, 45 from the position of the currently received data in the serial data stream received from the quantisers 30, 35). These items are concatenated to form the block header 85 for the current block; this block header is stored for later retrieval in a header FIFO 180.

Figure 5:
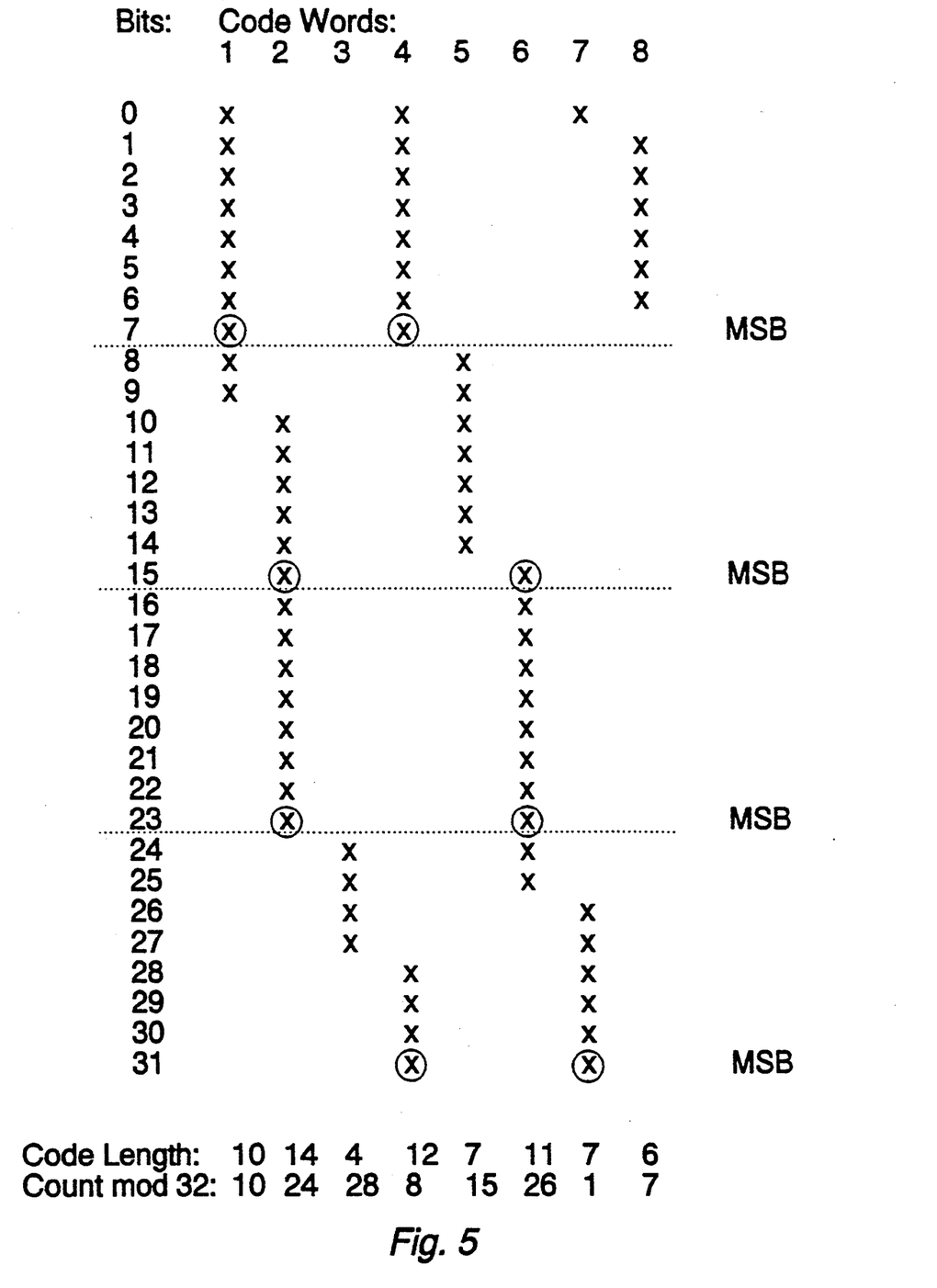
FIG. 5 is a schematic illustration showing the operation of the apparatus of FIG. 4.

FIG. 5 is a schematic illustration showing the operation of the block formatter circuit of FIG. 4. In FIG. 4 the 32 bits of the buffer 160 are numbered from 0 to 31 in a vertical direction and are arranged into four groups of 8 bits, where each group represents one of the 8-bit latches. Eight consecutive valid Huffman code words are illustrated (numbered from 1 to 8) having respective code lengths of 10, 14, 4, 12, 7, 11, 7 and 6. In the example shown, the count held by the format accumulator 10 is assumed to be zero when the first of the code words (code word 1) is received.

Code word 1 has a length of 10 bits. It is barrel-rotated by a number of bits corresponding to the count previously held by the format accumulator (i.e. zero), and so is written to the bits 0 to 9 of the buffer 160. Bit 7 of the buffer 160 is a most significant bit (MSB) of one of the four 8-bit latches, so writing to bit 7 triggers the previous contents of that latch to be transferred as an 8-bit word to the FIFO store 170.

When the second valid code word (code word 2) is received, its length (14 bits) is added to the count currently held by the format accumulator 120 (10 bits). Code word 2 is barrel-rotated by 10 bits (the previously held count). The enable generator 125 receives the current count output by the format accumulator 120 and the previous count held by the latch 130. This causes write-enables to be generated to control writing of the second code word into the bits 10 to 23 of the buffer 160. Bits 15 and 23 of the buffer 160 are MSBs of two respective 8-bit latches, so the existing contents of those latches are transferred as fixed length 8-bit words to the FIFO store 170.

The third received code word has a length of 4 bits, taking the count held by the format accumulator 120 to 28 bits. The length of the fourth code word (12 bits) is added to 28 bits in modulo-23 arithmetic. This means that the count supplied directly to the enable generator 135 is 8, and the count supplied from the latch 130 is 28. Accordingly the bits of the fourth code word are barrel-rotated by 28 bits and are written to bits 28 to 31 and 0 to 7 of the buffer 160. The buffer 160 thus continues to be written to and read from in a circular fashion.

Figure 6:
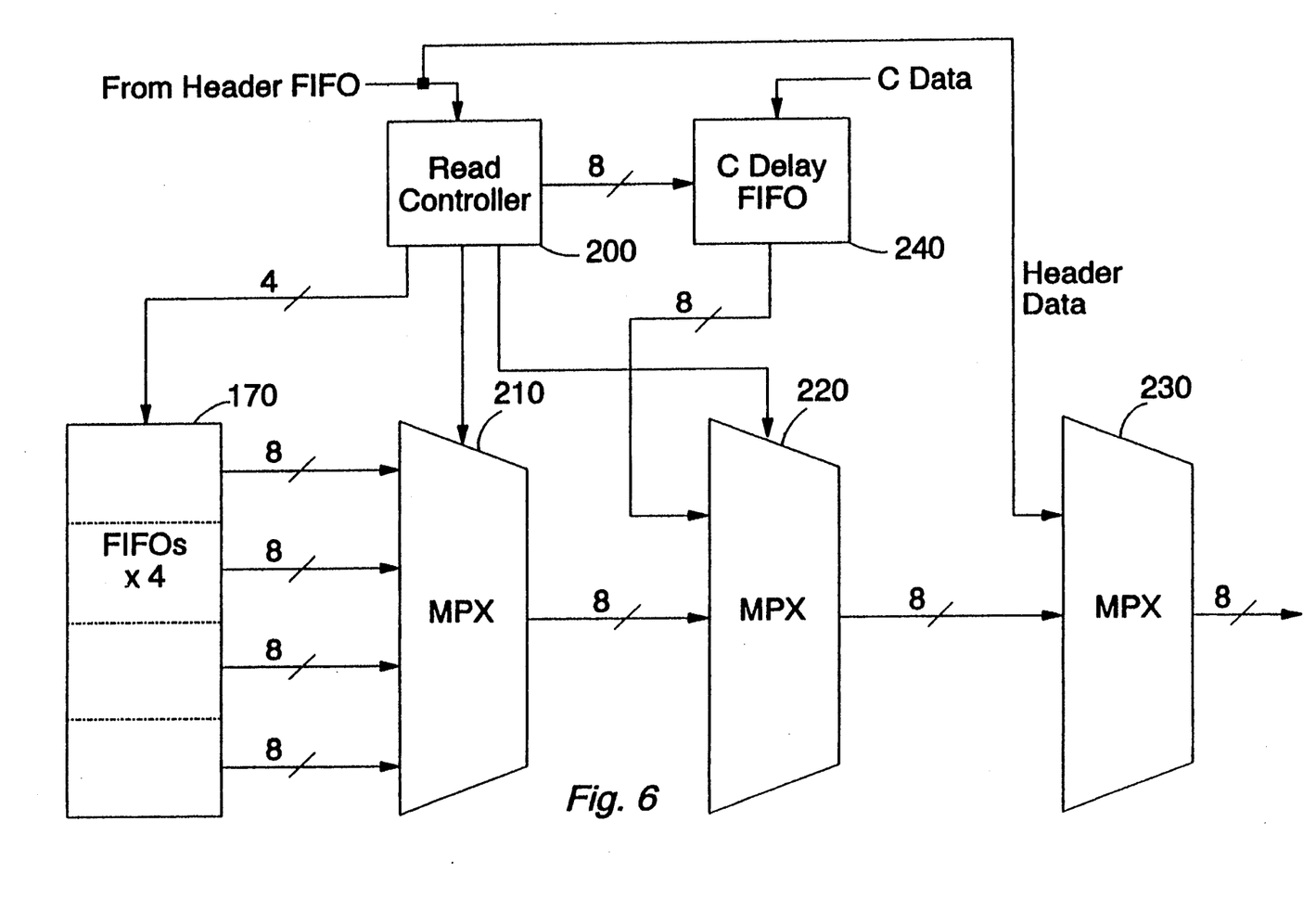
FIG. 6 is a schematic block diagram of the data output side of a block formatter.

FIG. 6 is a schematic block diagram of the data output side of the block formatter 10. A read controller 200, which receives information from the header FIFO 180, controls the reading of data from the FIFO store 170, the operation of 3 multiplexers 210, 220 and 230 and the operation of a delay FIFO 240.

for each formatted data block, the read controller receives from the header FIFO 180 an indication of the number of bytes of luminance data to be included in that data block. Since the bytes of luminance data were stored in the FIFO store in a cyclic fashion, they are read out under the control of the read controller 200 in an identical cyclic order. The bytes of luminance data read from the FIFO store are combined into a single 8-bit wide data stream by the multiplexer 210. In the data read from the FIFO store, the MSB of each Huffman code word is abutted against the LSB of the preceding code word. This means that the first byte to be read from the FIFO store must have the first bit of the first Huffman code word as its MSB.

A corresponding chrominance read controller (not shown) determines the number of chrominance data bytes to be included in the chrominance data section 100 of the data block by subtracting the number of bytes of luminance data from the total number of data bytes in the data block (i.e. 120 bytes). The chrominance read controller controls the reading of the appropriate number of bytes of chrominance data from the chrominance FIFO store into the delay FIFO 240, in which they are held during reading of the luminance data bytes from the FIFO store 170. The luminance and chrominance data bytes are then concatenated together by the multiplexer 220, and finally the header data is concatenated with these data by the multiplexer 230. The output of the multiplexer 230 comprises successive formatted data blocks, each data block having the order of a header section 85, a luminance data section 95, and a chrominance data section 100. Any remaining space in the formatted data blocks is padded with logical ones.

As mentioned above, after the Huffman codes have been formatted into data blocks by the block formatter 10, the formatted data blocks are subjected to error correction processing and channel encoding before being recorded on a magnetic tape (not shown).

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Data formatting apparatus for formatting variable bit length data words into successive discrete fixed bit length data words, said apparatus comprising:
    an N-bit circular buffer comprising a plurality of concatenated buffer sections, each said buffer section having a bit length equal to a bit length of said fixed bit length data words;
    a modulo-N counter for generating a count signal in response to a cumulative length of received variable bit length data words;
    means for storing a current variable bit length data word in said N-bit circular buffer at a bit position dependent on said count signal;
    detecting means associated with each said buffer section for detecting whether data has been stored in all bits of said buffer section; and
    means responsive to a detection that data has been stored in all bits of a buffer section for outputting stored data from said buffer section as a fixed bit length data word.

2. Apparatus according to claim 1, in which said means for storing comprises an N-bit barrel-rotator operable to barrel-rotate each said variable bit length data word by a number of bits dependent upon said count signal generated by said modulo-N counter in respect of a preceding variable bit length data word.

3. Apparatus according to claim 2, in which said means for storing comprises an enable generator, responsive to said count signal generated by said modulo-N counter in respect of a current and said preceding variable bit length data words, for generating respective write-enable signals to control writing of each bit of said current variable bit length data word from said barrel-rotator to said N-bit circular buffer.

4. Apparatus according to claim 3, in which said detecting means associated with each said buffer section is operable to detect generation of a write-enable signal to control writing to a predetermined bit in said buffer section.

5. Apparatus for formatting variable bit length luminance and chrominance data words which represent an image into respective fixed bit length luminance and chrominance data words, said apparatus comprising:
    first formatting means for formatting variable bit length luminance data words into successive fixed bit length luminance data words;
    second formatting means for formatting variable bit length chrominance data words into successive fixed bit length chrominance data words;
    a luminance data store for storing said fixed bit length luminance data words;
    a chrominance data store for storing said fixed bit length chrominance data words;
    means for reading said fixed bit length luminance data words from said luminance data store;
    means for reading said fixed bit length chrominance data words from said chrominance data store; and
    means for multiplexing said fixed bit length luminance data words read from said luminance data store and said fixed bit length chrominance data words read from said chrominance data store, to generate data blocks comprising a predetermined total number of fixed bit length luminance and chrominance data words;

wherein said first and second formatting means each comprise:

an N-bit circular buffer comprising a plurality of concatenated buffer sections, each said buffer section having a bit length equal to a bit length of said fixed bit length data words;

a modulo-N counter for generating a count signal in response to a cumulative length of received variable bit length data words;

means for storing a current variable bit length data word in said N-bit circular buffer at a bit position dependent on said count signal;

detecting means associated with each said buffer section for detecting whether data has been stored in all bits of said buffer section; and means responsive to a detection that data has been stored in all bits of a buffer section for outputting stored data from said buffer section as a fixed bit length data word.

6. Apparatus according to claim 5, in which each said data block comprises:

a luminance data section comprising a plurality of said fixed bit length luminance data words, concatenated with a chrominance data section comprising a plurality of said fixed bit length chrominance data words; and a block header indicative of a position in said data block of a boundary between said luminance data section and said chrominance data section.

7. Apparatus according to claim 6, in which said luminance data section and said chrominance data section in each data block respectively comprise luminance and chrominance data from the same portion of said representation.

8. Apparatus according to claim 7, comprising:

means for receiving variable bit length luminance data words and variable bit length chrominance data words from corresponding positions in said representation;

a total counter for generating a total data count in response to a cumulative number of fixed bit length luminance data words generated from said received variable bit length luminance data words and fixed bit length chrominance data words generated from said received variable bit length chrominance data words;

a boundary counter for generating a boundary count in response to a cumulative number of fixed bit length luminance data words generated from said received variable bit length luminance data words;

means for determining when said total data count reaches said predetermined total number: and means responsive to a determination that said total data count has reached said predetermined total number for generating said block header in response to said boundary count, for resetting said total counter, and for resetting said boundary counter.

9. Apparatus according to claim 5, in which said representation comprises frequency-separated image data representing said image in the two-dimensional spatial frequency domain.

10. Apparatus according to claim 5, in which each said data store comprises a first-in-first-out (FIFO) buffer.

11. Apparatus according to claim 1, in which said variable bit length data words comprise Huffman code words.

12. Apparatus according to claim 1, in which N=32 and in which said N-bit circular buffer comprises four 8-bit buffer sections.

13. A method of formatting variable bit length data words into successive discrete fixed bit length data words, said method comprising the steps of:

receiving variable bit length data words;

generating a modulo-N count signal in response to a cumulative length of said received variable bit length data words;

storing each said received variable bit length data word in an N-bit circular buffer at a bit position dependent on said count signal, said N-bit circular buffer comprising a plurality of concatenated buffer sections, each said buffer section having a bit length equal to a bit length of said fixed bit length data words;

detecting, for each said buffer section, whether data has been stored in all bits of said buffer section; and outputting stored data from a buffer section as a fixed bit length data word in response to a detection that data has been stored in all bits of said buffer section.

* * * * *